United States Patent
Magee et al.

(10) Patent No.: US 11,366,076 B2
(45) Date of Patent: *Jun. 21, 2022

(54) TRANSDUCER TEMPERATURE SENSING

(71) Applicant: Texas Instruments Incorporated, Dallas, TX (US)

(72) Inventors: David Patrick Magee, Allen, TX (US); Stephen John Fedigan, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 16/883,165

(22) Filed: May 26, 2020

(65) Prior Publication Data

US 2020/0284741 A1 Sep. 10, 2020

Related U.S. Application Data

(63) Continuation of application No. 15/887,923, filed on Feb. 2, 2018, now Pat. No. 10,663,418.

(Continued)

(51) Int. Cl.
*G01R 27/00* (2006.01)
*G01N 27/02* (2006.01)
(Continued)

(52) U.S. Cl.
CPC ......... *G01N 27/028* (2013.01); *B06B 1/0292* (2013.01); *B06B 1/0644* (2013.01);
(Continued)

(58) Field of Classification Search
CPC ...... G01N 27/02; G01N 27/028; G05D 23/19; G05D 23/1917; G01D 5/24; G01D 5/2405; G05B 1/03; G02B 27/0006; B08B 7/028

(Continued)

(56) References Cited

U.S. PATENT DOCUMENTS 3,681,626 A 8/1972 Puskas
4,019,073 A 4/1977 Vishnevsky et al.
(Continued)

FOREIGN PATENT DOCUMENTS

CN 1821536 A 8/2006
CN 1903455 A 1/2007
(Continued)

OTHER PUBLICATIONS

Extended European Search Report in corresponding 17878085.4, dated Nov. 22, 2019.

(Continued)

*Primary Examiner* — Thang X Le
(74) *Attorney, Agent, or Firm* — Ray A. King; Charles A. Brill; Frank D. Cimino

(57) ABSTRACT

In described examples, one or more devices include: apparatus including a lens element and a transducer to vibrate the lens element at an operating frequency when operating in an activated state; and controller circuitry. The controller circuitry is arranged to measure an impedance of the apparatus, to determine an estimated temperature of the apparatus in response to the measured impedance, to compare the estimated temperature against a temperature threshold for delineating an operating temperature range of the apparatus, and to toggle an activation state of the transducer in response to comparing the estimated temperature against the temperature threshold.

17 Claims, 9 Drawing Sheets

Related U.S. Application Data

(60) Provisional application No. 62/454,149, filed on Feb. 3, 2017.

(51) Int. Cl.

| | | |
|---|---|---|
| *G01K 7/16* | (2006.01) | |
| *B06B 1/02* | (2006.01) | |
| *G05D 23/19* | (2006.01) | |
| *G05B 1/03* | (2006.01) | |
| *H03K 7/08* | (2006.01) | |
| *B06B 1/06* | (2006.01) | |

(52) U.S. Cl.
CPC .............. *G01K 7/16* (2013.01); *G05B 1/03* (2013.01); *G05D 23/1917* (2013.01); *H03K 7/08* (2013.01)

(58) Field of Classification Search
USPC ........................................................ 324/600
See application file for complete search history.

(56) References Cited

U.S. PATENT DOCUMENTS

| | | | |
|---|---|---|---|
| 4,271,371 A | 6/1981 | Furuichi et al. | |
| 4,556,467 A | 12/1985 | Kuhn et al. | |
| 4,607,652 A | 8/1986 | Yung | |
| 4,654,554 A * | 3/1987 | Kishi | H04R 1/22 310/322 |
| 4,691,725 A | 9/1987 | Parisi | |
| 4,710,233 A | 12/1987 | Hohmann et al. | |
| 4,836,684 A | 6/1989 | Javorik et al. | |
| 4,852,592 A | 8/1989 | DeGangi et al. | |
| 4,870,982 A | 10/1989 | Lou | |
| 5,005,015 A | 4/1991 | Dehn et al. | |
| 5,037,189 A | 8/1991 | Fujie et al. | |
| 5,071,776 A | 12/1991 | Matsushita et al. | |
| 5,113,116 A | 5/1992 | Wilson | |
| 5,136,425 A * | 8/1992 | Fujie | B06B 1/0651 15/250.003 |
| 5,155,625 A * | 10/1992 | Komatsu | B60R 1/0602 219/219 |
| 5,178,173 A | 1/1993 | Erickson et al. | |
| 5,313,333 A | 5/1994 | O'Brien et al. | |
| 5,706,840 A | 1/1998 | Schneider et al. | |
| 5,853,500 A | 12/1998 | Joshi et al. | |
| 6,064,259 A | 5/2000 | Takita | |
| 6,607,606 B2 | 8/2003 | Bronson | |
| 6,880,402 B1 | 4/2005 | Couet et al. | |
| 7,215,372 B2 | 5/2007 | Ito et al. | |
| 7,705,517 B1 | 4/2010 | Koen et al. | |
| 8,286,801 B2 | 10/2012 | Youngs | |
| 8,293,026 B1 | 10/2012 | Bodor et al. | |
| 8,494,200 B2 | 7/2013 | Ram | |
| 8,899,761 B2 | 12/2014 | Tonar et al. | |
| 9,070,856 B1 | 6/2015 | Rose et al. | |
| 9,080,961 B2 | 7/2015 | Adachi | |
| 9,084,053 B2 | 7/2015 | Parkins | |
| 9,095,882 B2 * | 8/2015 | Shimada | H04N 5/357 |
| 9,226,076 B2 | 12/2015 | Lippert et al. | |
| 9,253,297 B2 | 2/2016 | Abe et al. | |
| 9,573,165 B2 | 2/2017 | Weber | |
| 10,780,467 B2 | 9/2020 | Revier et al. | |
| 2002/0139394 A1* | 10/2002 | Bronson | G02B 27/0006 134/6 |
| 2006/0285108 A1 | 12/2006 | Morrisroe | |
| 2007/0046143 A1 | 3/2007 | Blandino | |
| 2007/0103554 A1 | 5/2007 | Kaihara et al. | |
| 2007/0159422 A1 | 7/2007 | Blandino | |
| 2008/0198458 A1 | 8/2008 | Kashiyama | |
| 2008/0248416 A1 | 10/2008 | Norikane et al. | |
| 2010/0165170 A1 | 7/2010 | Kawai et al. | |
| 2010/0171872 A1 | 7/2010 | Okano | |
| 2011/0073142 A1* | 3/2011 | Hattori | B60S 1/56 134/56 R |
| 2011/0228389 A1 | 9/2011 | Ohashi | |
| 2012/0224309 A1 | 9/2012 | Ikeda | |
| 2013/0170685 A1 | 7/2013 | Oh | |
| 2013/0242481 A1 | 9/2013 | Kim | |
| 2013/0333978 A1 | 12/2013 | Abe | |
| 2014/0033454 A1 | 2/2014 | Koops et al. | |
| 2014/0218877 A1 | 8/2014 | Wei | |
| 2014/0253150 A1 | 9/2014 | Menzel | |
| 2015/0185592 A1* | 7/2015 | Eineren | G03B 17/02 348/375 |
| 2015/0277100 A1 | 10/2015 | Novoselov | |
| 2016/0178898 A1 | 6/2016 | Eineren et al. | |
| 2016/0266379 A1 | 9/2016 | Li et al. | |
| 2017/0361360 A1 | 12/2017 | Li et al. | |
| 2018/0085784 A1 | 3/2018 | Fedigan et al. | |
| 2018/0085793 A1 | 3/2018 | Fedigan | |
| 2018/0117642 A1 | 5/2018 | Magee et al. | |
| 2018/0161829 A1* | 6/2018 | Horie | B08B 3/14 |
| 2018/0239218 A1 | 8/2018 | Ikeuchi et al. | |
| 2018/0264526 A1 | 9/2018 | Kim | |
| 2018/0275397 A1 | 9/2018 | Chung et al. | |
| 2018/0304282 A1 | 10/2018 | Cook | |
| 2018/0304318 A1 | 10/2018 | Re-vier | |
| 2018/0326462 A1 | 11/2018 | Revier | |
| 2019/0277787 A1 | 9/2019 | Chung et al. | |

FOREIGN PATENT DOCUMENTS

| | | |
|---|---|---|
| CN | 101063830 A | 10/2007 |
| CN | 101274326 | 10/2008 |
| CN | 201223863 Y | 9/2010 |
| CN | 201579230 U | 9/2010 |
| CN | 103191886 A | 7/2013 |
| CN | 103286097 A | 9/2013 |
| CN | 103312948 | 9/2013 |
| CN | 103376612 | 10/2013 |
| CN | 103775869 A | 5/2014 |
| DE | 102012214650 | 2/2014 |
| EP | 1703062 | 9/2006 |
| EP | 2479595 | 7/2012 |
| EP | 2777579 | 4/2015 |
| EP | 2873572 | 5/2015 |
| JP | 2009283069 | 12/2009 |
| JP | 5608688 | 10/2014 |
| KR | 20130076250 | 7/2013 |
| WO | 2007005852 | 1/2007 |
| WO | 2010104867 | 9/2010 |
| WO | WO2016167110 A1 | 2/2018 |
| WO | 2018207041 | 11/2018 |

OTHER PUBLICATIONS

Partial Supplementary European Search Report for 18747814.4 dated Jan. 30, 2020.
International Search Report for PCT/US2017/064530 dated Apr. 5, 2018.
International Search Report for PCT Application No. PCT/US2018/016714, dated Jun. 21, 2018 (2 pages).
Howard, "High speed photography of ultrasonic atomization," Thesis, Brown University, May 13, 2010, 39 pages.
Ziaei-Moayyed et al., "Electrical Deflection of Polar Liquid Streams: A Misunderstood Demonstration," Journal of Chemical Education, vol. 77, No. 11, Nov. 2000, 4 pages.
Graff, "Wave Motion in Elastic Solids", Dover, 1991 (3 pages).
Hagedorn et al., "Travelling Wave Ultrasonic Motors, Part I: Working Principle and Mathematical Modelling of the Stator", Journal of Sound and Vibration, 1992, 155(1), pp. 31-46.
U.S. Appl. No. 15/492,433, entitled "Methods and Apparatus for Surface Wetting Control," filed Apr. 20, 2017 (46 pages).
U.S. Appl. No. 15/492,286, entitled "Methods and Apparatus Using Multistage Ultrasonic Lens Cleaning for Improved Water Removal," filed Apr. 20, 2017 (62 pages).
U.S. Appl. No. 15/492,315, entitled "Methods and Apparatus for Ultrasonic Lens Cleaner Using Configurable Filter Banks," filed Apr. 20, 2017 (63 pages).

(56) References Cited

OTHER PUBLICATIONS

U.S. Appl. No. 15/492,395, entitled "Methods and Apparatus for Electrostatic Control of Expelled Material from Lens Cleaners," filed Apr. 20, 2017 (28 pages).
International Search Report for PCT/US2017/059536 dated Feb. 28, 2018.
Vaseiljev, "Ultrasonic system for solar panel cleaning", Sensors and Actuators A, vol. 200, Oct. 1, 2013, pp. 74-78.
Kazemi, "Substrate cleaning using ultrasonics/megasonics," 2011 IEEE/SEMI Advanced Semiconductor Manufacturing Conference, Saratoga Springs, NY, 2011, pp. 1-6.
Brereton, "Particle Removal by Focused Ultrasound", Journal of Sound and Vibration vol. 173, Issue 5, Jun. 23, 1994, pp. 683-698.
Gale, "Removal of Particulate Contaminants using Ultrasonics and Megasonics: A Review", Particulate Science and Technology, 1994,13:3-4, 197-211.
Lee, "Smart self-cleaning cover glass for automotive miniature cameras," 2016 IEEE 29th International Conference on Micro Electro Mechanical Systems (MEMS), Shanghai, 2016, pp. 83-86.
Extended European Search Report for 17866470.2 dated Oct. 8, 2019.

\* cited by examiner

TRANSDUCER TEMPERATURE SENSING

CROSS-REFERENCE TO RELATED APPLICATION

This application is a continuation of U.S. patent application Ser. No. 15/887,923, filed Feb. 2, 2018, which claims the priority of U.S. Provisional Patent Application No. 62/454,149, filed Feb. 3, 2017, which is incorporated herein by reference in its entirety.

BACKGROUND

Electronic optical sensors are widely used for generating electronic images. Often, such sensors (e.g., "cameras") are located in places remote to a viewer. The remote locations include places (e.g., external to vehicles) where contaminants (e.g. moisture and/or dirt) from the environment can cloud or otherwise obscure the camera lens, such that degraded images are generated by a camera having an obscured lens. The degradation of the image quality can decrease safety or security in many applications. Various techniques for automatically cleaning the camera lenses include water sprayers, mechanical wipers, or air jet solutions. Such approaches are not practical or too costly in a variety of applications.

SUMMARY

In described examples, one or more devices include: an apparatus including a lens element and a transducer to vibrate the lens element at an operating frequency when operating in an activated state, and controller circuitry. The controller circuitry is arranged to measure an impedance of the apparatus, to determine an estimated temperature of the apparatus in response to the measured impedance, to compare the estimated temperature against a temperature threshold for delineating an operating temperature range of the apparatus, and to toggle an activation state of the transducer in response to comparing the estimated temperature against the temperature threshold.

DETAILED DESCRIPTION

In this description: (a) the term "portion" means an entire portion or a portion that is less than the entire portion; (b) the term "housing" means a package or a sealed subassembly/assembly, which can include control circuitry, a transducer, lenses and an imaging sensor in a local environment that is sealed from an outside environment.

Ultrasonic vibration of lens surfaces (including lens covers) of camera systems (e.g. automotive systems including rear view and/or surround view systems) can be more cost effective than various water sprayer, mechanical wiper, or air jet solutions. As described herein, piezoelectric transducers (e.g., within a camera housing) can be monitored in a feedback loop structure without including a thermocouple in the feedback loop. The piezoelectric transducer is controlled by estimating a temperature of the piezoelectric transducer, such that, for example, the buildup of heat (which can be caused by activating the piezoelectric transducer) is limited by a comparison to a temperature threshold. The limiting of the buildup of heat helps prevent the permanent depolarization of the piezoelectric transducer (e.g., which could adversely affect the ability of the piezoelectric transducer to vibrate).

The apparatus and methods described herein for controlling and operating a piezoelectric transducer can help ensure that the temperature of the piezoelectric transducer does not reach more than one-half a Curie temperature (in degrees Celsius) of the piezo material of the transducer being controlled. In example embodiments, the transducer lifetime can be extended by the avoidance of operating the piezoelectric transducer at potentially damaging temperatures.

Figure 1:
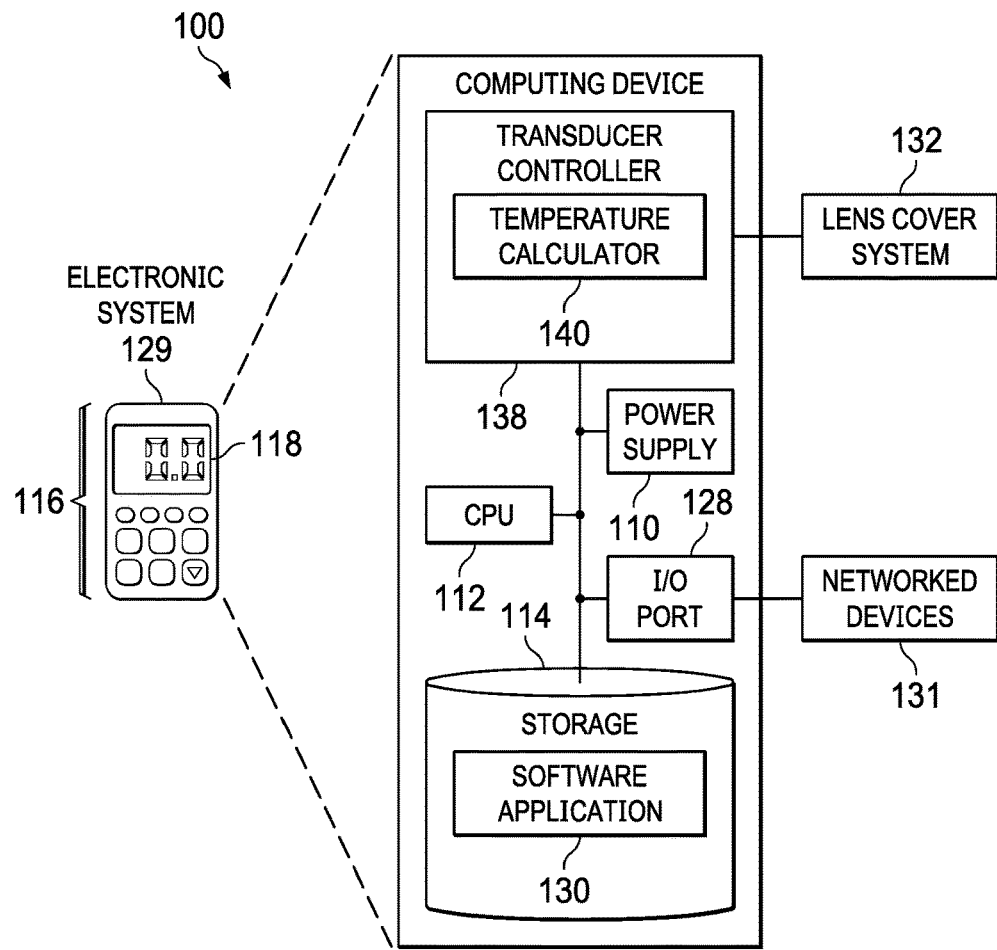
FIG. 1 is a block diagram of an example computing device 100 for controlling a transducer coupled to a lens element.

FIG. 1 is a block diagram of a computing device 100 for controlling a transducer coupled to a lens element. For example, the computing device 100 is or is incorporated into, or is coupled (e.g., connected) to an electronic system 129, such as a computer, electronics control "box" or display, controllers (including wireless transmitters or receivers), or any type of electronic system operable to process information.

In example systems, a computing device 100 includes a megacell or a system-on-chip (SoC) that includes control logic such as a central processing unit (CPU) 112, a storage 114 (e.g., random access memory (RAM)) and a power supply 110. For example, the CPU 112 can be a complex instruction set computer (CISC)-type CPU, reduced instruction set computer (RISC)-type CPU, microcontroller unit (MCU), or digital signal processor (DSP). The storage 114 (which can be memory such as on-processor cache, off-processor cache, RAM, flash memory, or disk storage) stores one or more software applications 130 (e.g., embedded applications) that, when executed by the CPU 112, perform any suitable function associated with the computing device 100. The processor is arranged to execute code (e.g., firmware instructions and/or software instructions) for transforming the processor into a special-purpose machine having the structures—and the capability of performing the operations—described herein.

The CPU 112 includes memory and logic circuits that store information that is frequently accessed from the storage 114. The computing device 100 can be controlled by a user operating a UI (user interface) 116, which provides output to and receives input from the user during the execution the software application 130. The UI output can include indicators such as the display 118, indicator lights, a speaker, and vibrations. The UI input can include sensors for receiving audio and/or light (using, for example, voice or image recognition), and can include electrical and/or mechanical devices such as keypads, switches, proximity detectors, gyros, and accelerometers. For example, the UI can be responsive to a vehicle operator command to clear an exterior surface of a backup camera of the vehicle.

The CPU 112 and the power supply 110 are coupled to I/O (Input-Output) port 128, which provides an interface that is configured to receive input from (and/or provide output to) networked devices 131. The networked devices 131 can include any device (including test equipment) capable of point-to-point and/or networked communications with the computing device 100. The computing device 100 can be coupled to peripherals and/or computing devices, including tangible, non-transitory media (such as flash memory) and/or cabled or wireless media. These and other such input and output devices can be selectively coupled to the computing device 100 by external devices using wireless or cabled connections. The storage 114 is accessible, for example, by the networked devices 131. The CPU 112, storage 114, and power supply 110 are also optionally coupled to an external power source (not shown), which is configured to receive power from a power source (such as a battery, solar cell, "live" power cord, inductive field, fuel cell, capacitor, and energy storage devices).

The transducer controller 138 includes control and signaling circuitry components for resonating a transducer of the lens cover system 132, such that the lens element can be cleaned by expelling foreign material (e.g., shaken clean of moisture). As described hereinbelow, the transducer controller 138 includes a temperature calculator 140 for determining a temperature of the lens cover system 132, such that, for example, the transducer of the lens cover system 132 is operated within a safe range of operating parameters.

Figure 2:
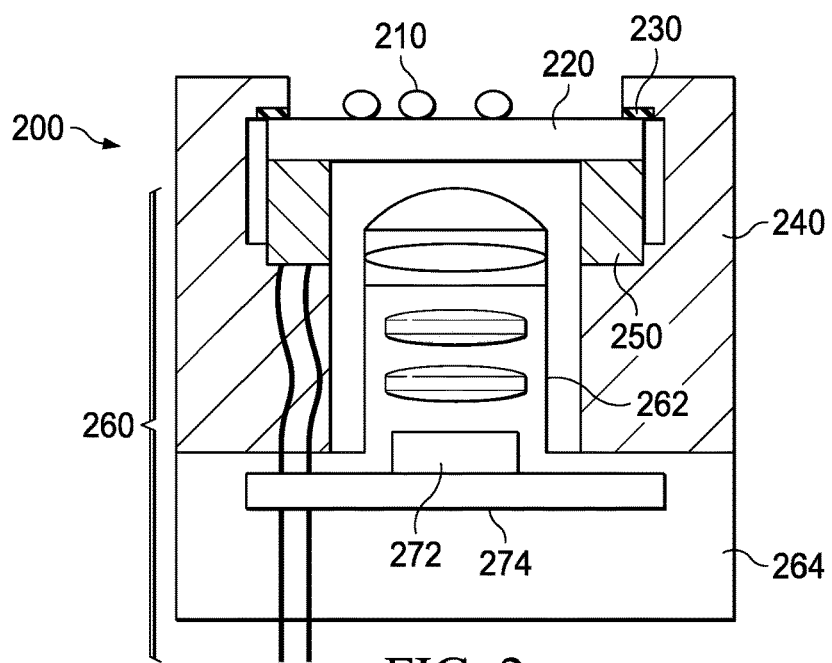
FIG. 2 is a cross-section view of an example camera lens cover system.

FIG. 2 is a cross-section view of an example camera lens cover system. The camera lens cover system 200 generally includes a lens element 220, a seal 230, a housing 240, a transducer 250, and a camera 260. The camera 260 includes a camera lens 262, a camera base 264, a photodetector 272, and controller circuitry 274. The transducer 250 is operable to vibrate at a selected frequency (such as a factory-selected frequency or an operator-selected frequency) for motivating the dispersal of the moisture 210 (or other foreign materials) from the exterior (e.g., upper) surface of the lens element 220.

The lens element 220 is a transparent element elastically captivated in a distal (e.g., upper) portion of the housing 240. The lens element 220 is arranged to receive light from surrounding areas and to optically couple the received light to the photodetector 272 (e.g., via the camera lens 262). The lens element 220 is arranged to protect the camera lens 262 against moisture 210 intrusion, for example. The moisture 210 can be in the form of frost, water drops, and/or a film of condensation. Foreign materials (such as the moisture 210 and dirt particles) can block and/or diffuse light, such that at least some of the received light is prevented from reaching the camera lens (e.g., compound lens) 262. In an embodiment, the lens element 220 can be a focusing lens (e.g., for refractively focusing light).

A seal 230 (such as a rubber seal) is arranged to elastically captivate the lens element 220 to the housing 240 and to seal a cavity (e.g., in which the camera lens 262 is arranged) against intrusion of moisture 210 into the cavity. The intrusion of moisture 210 and other foreign substances into the cavity can facilitate condensation inside the lens cover system that can obstruct the camera's view. Moisture inside the lens cover system can also damage the controller circuitry 274 electronics and/or the pixels (e.g., pixel cells) of the photodetector 272. The cavity extends inwards from the lens element 220 to a proximal (e.g., lower) portion of the housing 240.

The cavity is also formed by the camera base 264, which is coupled to (or formed as part of) the housing 240. The camera base 264 can include a photodetector 272 and controller circuitry 274. The photodetector 272 can be a video detector for generating electronic images (e.g., video streams) in response the focused light coupled through the lens element 220 and the camera lens (which can include lenses). The controller circuitry 274 can include: (a) a printed circuit board; (b) circuitry of the transducer controller 138; and (c) and the circuitry of the temperature calculator 140 for controlling the lens cover system 132 (e.g., where such circuitry and the lens cover system are arranged in a feedback loop structure). The controller circuitry 274 is coupled to external power, control, and information systems using wiring and/or optical conduits (such as fibers).

The transducer 250 is mechanically coupled to the lens element 220. The transducer 250 can be affixed to the lens element 220 by an intervening adhesive layer (e.g., a high-temperature resistant epoxy). In operation, the transducer 250 is arranged to vibrate (e.g., at a selected frequency) the lens element 220 in response to transducer driver signals. The transducer driver signals are controllably modulated, such that the transducer 250 is controllably excited in response to the transducer driver signals. The transducer driver signals can be amplitude modulated, such that vibrating lens element 220 can controllably expel moisture 210 such foreign material from the external surface of the lens element 220 (e.g., external to the cavity).

A lens cover system 200 can include the transducer 250, the housing 240, the seal 230, and the lens element 220. The temperature of the lens cover system can be estimated in response to (e.g., as a function of) electrical properties of the lens cover system. The transducer 250 can be controllably excited in response to the estimated temperature to efficiently remove obscuring foreign material (including potentially obscuring foreign material) from the lens element 220 without exceeding a threshold temperature limit. The transducer 250 can be destroyed or degraded when operated for prolonged periods at excessively elevated temperatures.

Figure 3:
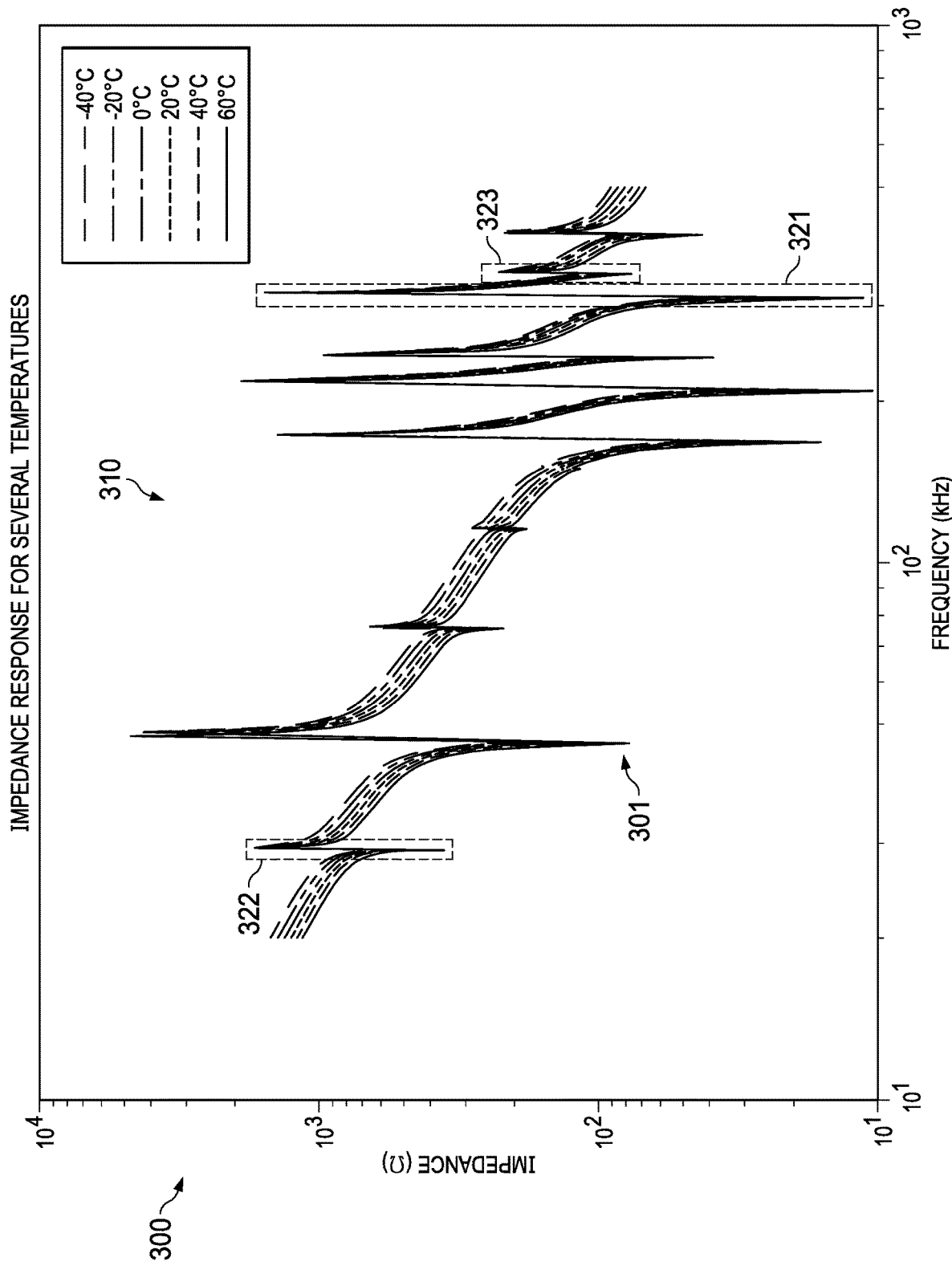
FIG. 3 is a waveform diagram of an impedance response of an example camera lens cover system over a broad frequency range.

The impedance response of the lens cover system 200 varies according to the temperature of the lens cover system 200. As described herein, the relationship between the estimated temperature of the lens cover system 200 and the measured electrical impedance of the lens cover system is substantially linear within a frequency range. FIG. 3 shows an impedance response of an example lens cover system over a frequency range of selected temperatures.

FIG. 3 is a waveform diagram of an impedance response of an example lens cover system over a broad frequency range. The waveform diagram 300 includes a lens cover system impedance response 310. The lens cover system impedance response 310 shows the impedance in Ohms over a frequency range between 10 kHz to around 1 MHz. The example lens cover system can be a lens cover system such as the transducer 250 described hereinabove.

The "zeros" of the impedance response correspond to the series resonance properties, which correspond to the electromechanical vibration properties (such as resonance) of a lens cover system that includes the example transducer. The electromechanical resonances of the system occur at frequencies in which relatively larger vibration amplitudes occur for a variable electrical input amplitude stimulus. For example, electromechanical resonances occur at frequency ranges 321, 322, and 323. The zeros are indicated by valleys (such as valley 301) in the curve 310. A reduced frequency range (e.g., for a "zoomed in" view) of the impedance response 310 is described hereinbelow with respect to FIG. 4.

Figure 4:
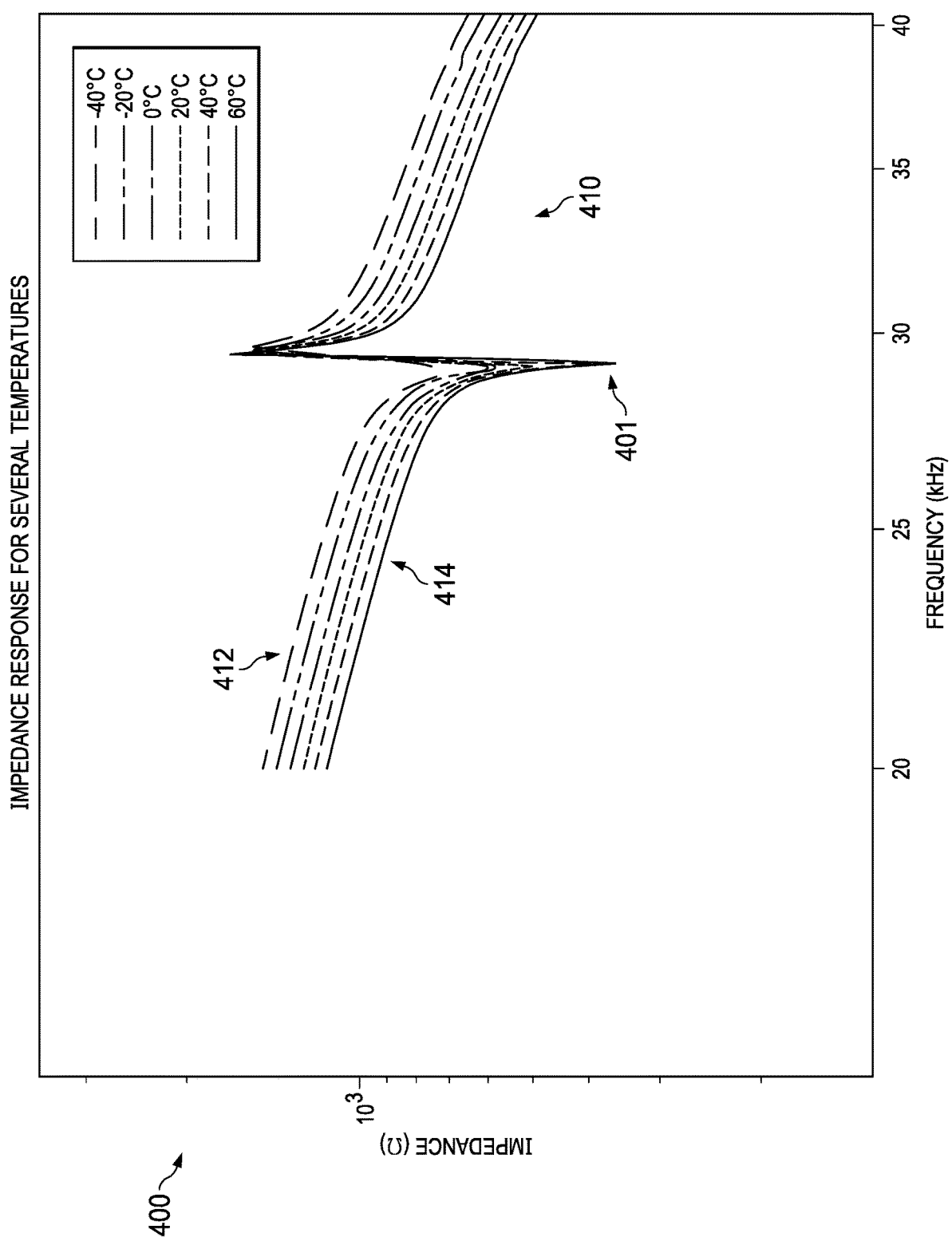
FIG. 4 is a waveform diagram of an impedance response of an example camera lens cover system over a reduced frequency range.

FIG. 4 is a waveform diagram of an impedance response of an example lens cover system over a reduced frequency range. The waveform diagram 400 includes an example lens cover system impedance response 410. The lens cover system impedance response 410 shows the impedance response of the example lens cover system over a reduced frequency range (e.g., with respect to the frequency range shown in FIG. 3).

The lens cover system impedance response 410 includes discrete temperature curves for indicating the lens cover system impedance at a discrete temperature selected from a range of temperatures. The range of selected discrete temperatures extends from a temperature of 40° C. to a temperature of −(minus) 60° C., where the temperature represented by each temperature curve differs from the represented temperature of an adjacent temperature curve by 20° C. The range of temperatures encompasses operating temperatures potentially encountered in operation of the example lens cover system in various example applications.

For example, the temperature curve 412 shows the example lens cover system impedance response in Ohms over a frequency range of around 20 kHz to 40 kHz at a temperature of −40° C., whereas the temperature curve 414 shows the lens cover system impedance response in Ohms over a frequency range of around 20 kHz to 40 kHz at a temperature of −60° C. The lens cover system impedance response 410 includes a valley 401, which indicates a resonance of the example lens cover system at around 29 kHz for all illustrated temperature responses.

At frequencies below 150 kHz (e.g., as shown by the lens cover system impedance response 310), the gain of an impedance response generally decreases as the temperature increases, such that the lens cover system impedance response 410 is inversely related to temperature within a selected operating frequency range (e.g., with exceptions occurring around the locations of resonant frequencies of the example transducer). The change in the impedance over temperature is linear (e.g., having a constant slope and having a change in impedance that is proportional to a step change in temperature).

For example, the vertical spacing (e.g., for a given frequency) between each temperature curve between temperature curves 412 and 414 of a selected operating frequency is equal (e.g., substantially equal). The selected operating frequency is selected from a frequency included in a linear response region, such as the linear response region extending between, at least, 20 kHz and 25 kHz). The equal spacing of the temperature curves between temperature curves 412 and 414 is indicative of a linear relationship between an operating temperature and a measured impedance at a selected operating frequency.

The temperature of the example transducer can be determined in response to a measurement of the impedance of the example transducer. For example, the example transducer is excited to vibration (e.g., in response to amplitude-modulated driver signals) at a frequency of a frequency range in which the change in the transducer impedance over frequency is linear.

The dependent variable temperature T as a function of the impedance variable Z for the example transducer is expressed as the linear equation:

$$T = -0.29*Z + 392.6 \quad (1)$$

which has a coefficient of determination $R^2$ value of $R^2 = 0.9932$ (e.g., which is substantially linear, and wherein the constant "−0.29" is a slope of the linear equation, and the constant "392.6" is a y-intercept of the linear equation). The dependent variable temperature T as a function of the impedance variable Z for the example transducer can also be expressed as the parabolic equation:

$$T = A*Z^2 + B*Z + C \quad (2)$$

where A, B and C are constants. When A=0, Equation (2) is reduced to the linear form (such as the form of Equation (1)). Accordingly, the selected operating frequency is selected from within a frequency region within which the relationship between the estimated temperature and the measured impedance is determinable as a quadratic function (e.g., according to the Equation (2)).

The determined relationship between the estimated temperature of the lens cover system and the actual (e.g., empirically measured) temperature of the example lens cover system is substantially linear when the coefficient of determination $R^2$ value is at least 0.95, for example. As the value of the coefficient of determination $R^2$ approaches unity, the statistical variance between an estimated value using the linear equation and the actual value is minimized. As the value of coefficient of determination recedes from unity, errors in the estimation increase, which can result in any of: (a) decreased temperature operating range; (b) increased safety margins; and (c) decreased life of the lens cover system.

Figure 5:
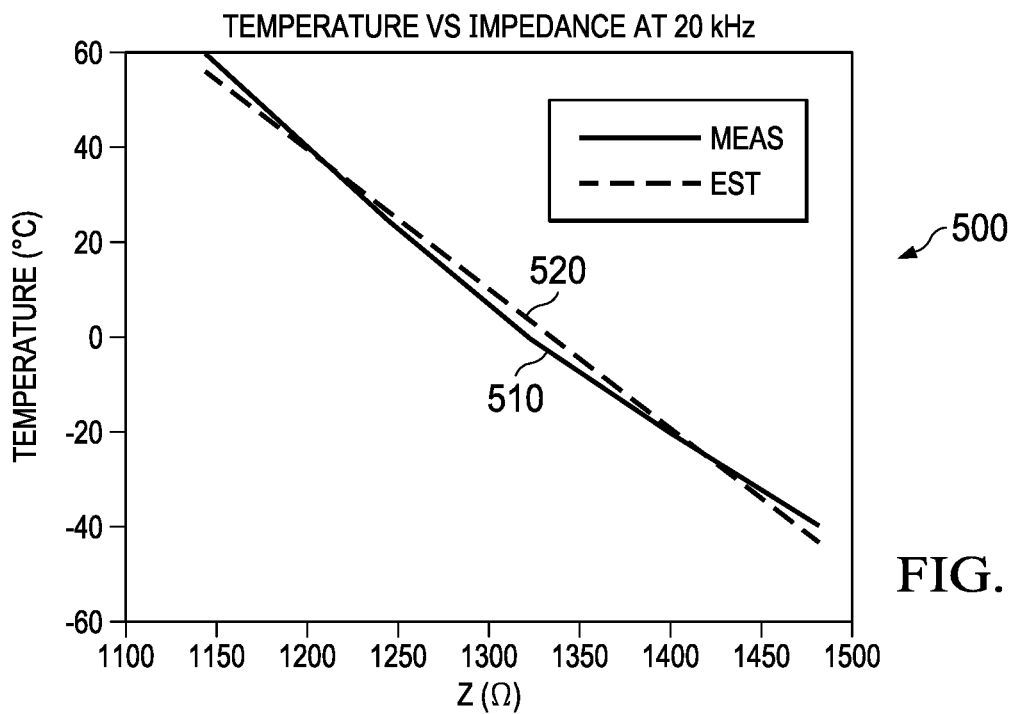
FIG. 5 is a plot diagram showing a linear relationship between the impedance response of an example camera lens cover system and operating temperatures thereof while operating at a selected operating frequency of 20 kHz.

FIG. 5 is a plot diagram showing a linear relationship between the impedance response of an example lens cover system and operating temperatures thereof while operating at a selected operating frequency of 20 kHz. The operating temperature of a lens cover system can be estimated by measuring the impedance of the lens cover system at a selected operating frequency, and by converting the impedance measurement to an estimated temperature (e.g., according to the relationship described by Equation (1) hereinabove). The conversion of the impedance measurement to an estimated temperature can be executed in response to calculating the Equation (1) result, and/or by indexing a lookup table to retrieve a result according to Equation (1).

Plot 500 shows the close statistical correlation between estimated curve 520 (EST) and a corresponding empirically measured curve 510 (MEAS). The actual (e.g., simulation value of) temperature is shown by the empirically measured curve 510. The estimated temperature (e.g., calculated using Equation (1)) is shown by the estimated curve 520. The estimated curve 520 can be estimated in simulations by controlling the temperature (e.g., from −60° C. to 40° C.) to derive impedance measurements (e.g., ranging from around 1150 Ohms to 1475 ohms) of the example lens cover system. The empirically measured curve 510 and the estimated curve 520 are statistically correlated to a high degree.

As shown by the plot 500, the relationship between the estimated temperature of the lens cover system and the actual (e.g., empirically measured) temperature of the example lens cover system is linear (e.g., substantially linear). The maximum error (e.g., determined in simulations between corresponding points of the estimated curve 520 and the empirically measured curve 510) shown by plot 500 is 3.7° C. Accordingly, the lens cover system temperature can be accurately estimated using a simple linear equation.

For example, a temperature error 3.7° C. of a temperature estimate is sufficiently accurate, such that the example lens cover system can be safely operated when the transducer controller maintains the estimated operating temperature of the example lens cover system below a temperature threshold for estimated temperatures. As described hereinbelow, the operating temperature threshold for estimated temperatures can be selected in response to the error margin of the estimated temperature measurement and the Curie temperature of the example transducer. The Curie temperature can be a temperature threshold beyond which the permanent polarization of piezoelectric materials of the example transducer is degraded. Accordingly, the temperature threshold is for delineating (e.g., an upper limit of) an operating temperature range below which the example transducer can be activated without (e.g., accelerated) depolarization.

In an embodiment, the impedance data over a range of temperatures for a selected operating frequency can be measured at discrete temperatures and stored as a lookup table in memory (e.g., which reduces processing requirements for calculating the equation otherwise calculated to determine an instant operating temperature). Simple (e.g., one-dimensional) linear interpolation can be used to more precisely determine the operating temperature (e.g., depending on a particular application of the described techniques, such as measuring a temperature outside a vehicle for determining a control decision described hereinbelow).

In an embodiment, impedance data measured over a range of temperatures and over a range of operating frequencies can be stored. The impedance data can be measured at discrete temperatures and discrete operating frequencies and stored as a lookup table in memory (e.g., such that firmware would not have to be programmed for controlling specific transducers, each of which can be operated mutually different frequencies according to a selected transducer and a selected application). Simple (e.g., two-dimensional) linear interpolation can be used to more precisely determine the operating temperature for a selected operating frequency.

Figure 6:
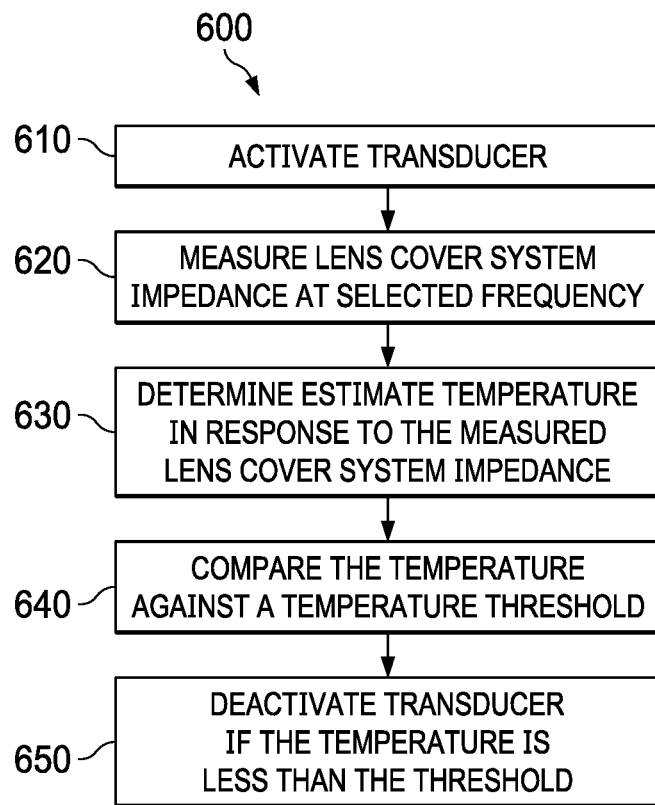
FIG. 6 is a flow diagram of an example process for estimating a temperature of an example camera lens cover system in response to an impedance measurement of the example camera lens cover system.

FIG. 6 is a flow diagram of an example process for estimating a temperature of an example lens cover system in response to an impedance measurement of the example lens cover system. The flow 600 can be performed by hardware circuits exclusive of programming commands. For example, the example process can be executed by apparatus including analog and/or digital control circuits (such as registers, adders, multipliers, voltage generators, and comparators) that are arranged (e.g., pipelined) according to the process 600, described hereinbelow.

The flow 600 begins at operation 610, in which an example transducer is activated (e.g., electrically excited to resonance at a selected frequency by assertion of amplitude-modulated transducer driver signals). For example, the amplitude-modulated transducer driver signals are asserted to effect a resonance of the example lens cover system at the selected frequency of 20 kHz (which is a frequency at which a linear relationship exists between the temperature of the example lens cover system and the impedance of the lens cover system). The flow continues to operation 620.

At operation 620, the impedance (e.g., effective impedance) of the activated example lens cover system is measured. The impedance can be measured in response to a voltage drop resulting from coupling the example transducer to the asserted amplitude-modulated transducer driver signals, for example. Because the example lens cover system is excited to resonate at 20 kHz, the measured impedance is derived in response to the example transducer resonating at the selected frequency of 20 kHz. The flow continues to operation 630.

At operation 630, the measured impedance is converted to an estimated temperature. The estimated temperature is determined according to the linear relationship between the impedance of the example lens cover system and the operating temperature of the example lens cover system. For example, the measured impedance can be converted to the estimated temperature by circuits operating according to the function of Equation (1), and/or the measured impedance can be converted to the estimated temperature in response to indexing a lookup table with values for creating the output of Equation (1). The lookup table includes addressable values that can be addressed using the independent variable (e.g., the measured impedance) as the index, and that are output as results for providing or determining the value of the dependent variable. For example, the addressable values are determined (e.g., pre-calculated before or after deployment of the system 100) according to Equation (1). The flow continues to operation 640.

At operation 640, the temperature is compared against a temperature threshold. The temperature threshold can be determined in response to the Curie temperature and a safety margin. The safety margin can be selected in response to the Curie temperature, the maximum expected error of the estimated lens cover system temperature, and a margin for "derating" the lens cover system for increasing product lifetime (e.g., increasing the mean-time-between-failure reliability factor) of the example lens cover system. The flow continues to operation 650.

At operation 650, the activation state of the transducer is toggled (e.g., activated when the example transducer is in a deactivated state, or is deactivated when the example transducer is in an activated state) in response to the comparison at operation 640. For example, the example transducer is deactivated if the temperature indicates that the example lens cover system has an operating temperature that approaches a self-damaging temperature. The example transducer can be deactivated when the comparison at operation 640 indicates that the estimated temperature exceeds half of the Curie temperature (in degrees Celsius) of the example transducer.

The process 600 can be invoked each time the example transducer is activated. The length of a periodic interval (e.g., fixed period) of time the example transducer is activated can be limited (for example) for the purpose of periodically re-invoking the process 600, which in turn limits the accumulation of heat from operating the example transducer. The example transducer can be deactivated in response to the expiration of a fixed period of time during which the example transducer is activated. The length of time selected for limiting the activated time of the example transducer can be selected in view of the rate of accumulation of heat during operation at the selected operating frequency and the relative sizes of safety margins. Accordingly, the rise of temperature of the example lens cover system is controllably limited below levels that are likely to permanently (e.g., without repair) damage the example transducer (e.g., without incurring the space, cost, and reliability considerations otherwise encountered by coupling a thermocouple to the example transducer).

Figure 7:
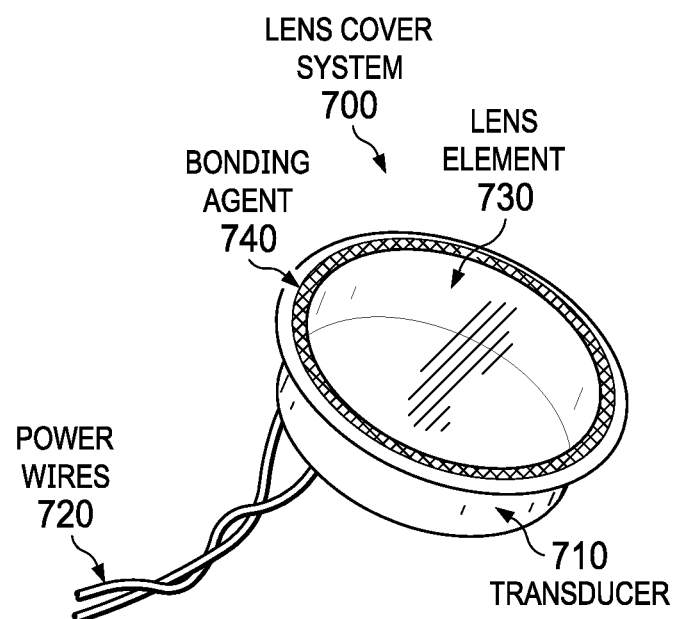
FIG. 7 is an isometric view of an example camera lens cover system.

FIG. 7 is an isometric view of an example camera lens cover system. The camera lens cover system 700 generally includes a transducer 710, power wires 720, a lens element 730 and bonding agent 740. The transducer 710 of the camera lens cover system 700 can be a cylindrical transducer such as transducer 250, described hereinabove, that is arranged to apply ultrasonic vibrations for cleaning a camera lens cover.

The transducer 710 is arranged to vibrate a mechanically coupled lens cover (e.g., the lens element 730) in response to being driven by an electronic amplifier at frequencies ranging from around 20 kHz to 2.0 MHz. The transducer 710 can be driven at a given excitation frequency and a resulting impedance sensed by coupling signals to and from the transducer via the power wires 720. The resulting impedance can be affected by temperature, mechanical characteristics, electrical characteristics and the frequency at which the transducer is driven, for example. A lens element 730 is secured to a distal surface of the transducer 710 by a bonding agent 740 (e.g. epoxy) disposed (e.g., as a circular shape) between the distal surface of the transducer 710 and an adjacent portion of a surface of the lens element 730. The seal between the transducer element and the lens element 730 helps prevent the intrusion of moisture into a sealed cavity (e.g., which can be formed by a camera base, the transducer 710, the lens element 730, and the bonding agent 740).

Environmental moisture (e.g., water drops, water droplets and/or a film of condensation) can adhere to an exterior surface of the lens element 730. The moisture can occlude light from being clearly received by a camera lens in the sealed cavity. The transducer 710 is operable to vibrate at a selected frequency for motivating the dispersal of the moisture (or other foreign materials) from the exterior (e.g., outer) surface of the lens element 730. When droplets of moisture and/or a film of condensation remain on the exterior surface of the lens element 730, the remaining moisture can cause saturation of the image sensor optically coupled to the camera lens when, for example, incident light encounters the exterior surface of the lens element 730 at an oblique angle.

The exterior surface of the lens element 730 can be formed without a "lip" (or can be formed with a lip arranged with channels extending therethrough), which provides a path for moisture migration during vibration. Vibration of the sealed lens element urges moisture along the path for moisture migration, for example, because the vibration helps overcome surface tension of the moisture (which otherwise helps the moisture to adhere to itself as well as to adhere to the outer surface of the lens element 730). As described hereinbelow with respect to FIG. 8, the transducer 710 is arranged to (e.g., both) vibrate at the selected frequency and to generate thermal energy for heating the lens element 730.

Figure 8:
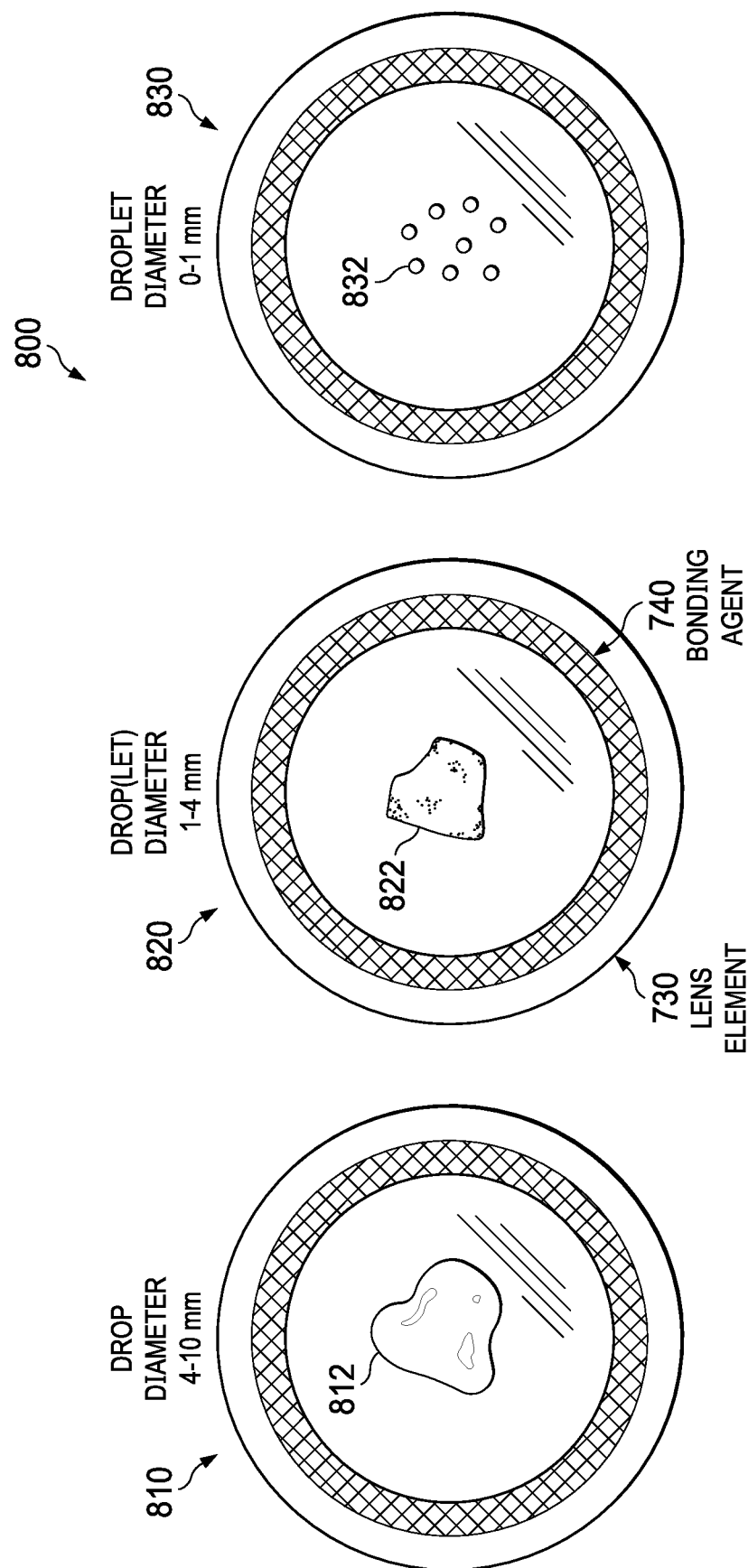
FIG. 8 is an external view of example foreign contaminant volumes for an example camera lens cover system.

FIG. 8 is an external view of foreign contaminant volumes for an example camera lens cover system. Water drops "contaminate" a lens surface (e.g., of lens element 730), such that a view through the lens surface is blocked or otherwise obscured. In an example, a camera lens cover system is vertically oriented, such that the lens element 730 is level, and such that moisture is not removed by gravity (e.g., for the purpose of illustration) during the moisture removal stages 810, 820, and 830. In the example, the multi-stage cleaning diagram 800 includes a large-volume cleaning stage 810 (e.g., for generally removing drops greater than around 15 μL in volume, such as drop 812), a medium-volume cleaning stage 820 (e.g., for generally removing drops less than around 15 μL in volume, such as drop 822), and a small-volume cleaning stage 830 (e.g., for removing residual moisture, such as droplets 832).

In the large-volume cleaning stage 810, the transducer is arranged to vibrate in a first mode at a first selected frequency such that water drops of around 4-10 mm (or greater) diameter are dispersed (e.g., atomized or otherwise reduced in size) in response to vibration generated at the first selected frequency. In the first mode (in stage 810), a large-volume cleaning excitation signal is applied to the transducer to generate vibration at the first selected frequency. The first selected frequency can be a frequency in a frequency range at which electromechanical resonances occur. The first selected frequency can be characterized by a relatively high frequency vibration that consumes a relatively high amount of power. The large-volume cleaning stage 810 can be followed by the medium-volume cleaning stage 820.

In the medium-volume cleaning stage 820, the transducer is arranged to vibrate in a second mode at a second selected frequency, such that water drops (or droplets) of around 1-4 mm diameter are dispersed (e.g., atomized or otherwise reduced in size) in response to the vibration generated at the second selected frequency. In the second mode (in stage 820), a medium-volume cleaning excitation signal is applied to the transducer to generate vibration at the second selected frequency. The second selected frequency can be a frequency in a frequency range at which electromechanical resonances occur. The second selected frequency can be a frequency that is lower than the first selected frequency. The first selected frequency can be characterized by a relatively low frequency vibration that consumes a relatively low amount of power. The medium-volume cleaning stage 810 can be followed by a small-volume cleaning stage 830.

In the small-volume cleaning stage 830, the transducer is arranged to vibrate in a third mode at a third selected frequency, such that water droplets of around 0-1 mm diameter are evaporated (e.g., atomized or otherwise dispersed) in response to the heat and vibration generated at the third selected frequency. In the third mode (in stage 830), a heating excitation signal is applied to the transducer to generate vibration at the third selected frequency. The third selected frequency can be a frequency in a frequency range at which electromechanical resonances occur. The water droplets of around 0-1 mm diameter are difficult to remove by vibrations because, for example, the surface tension of the water as well as the relatively high van der Waals forces exerted between the surface of the lens cover and the water.

The third selected frequency can be a frequency that is higher than the first selected frequency. The third selected frequency can be characterized by a relatively high frequency vibration that consumes a relatively high amount of power. The heat generated by the transducer is thermally coupled to the lens element via the bonding agent 740 interposed between the transducer 710 and the lens element 730. The heat transferred to the lens element 730 helps remove any residual droplets, condensates on the lens element.

Figure 9:
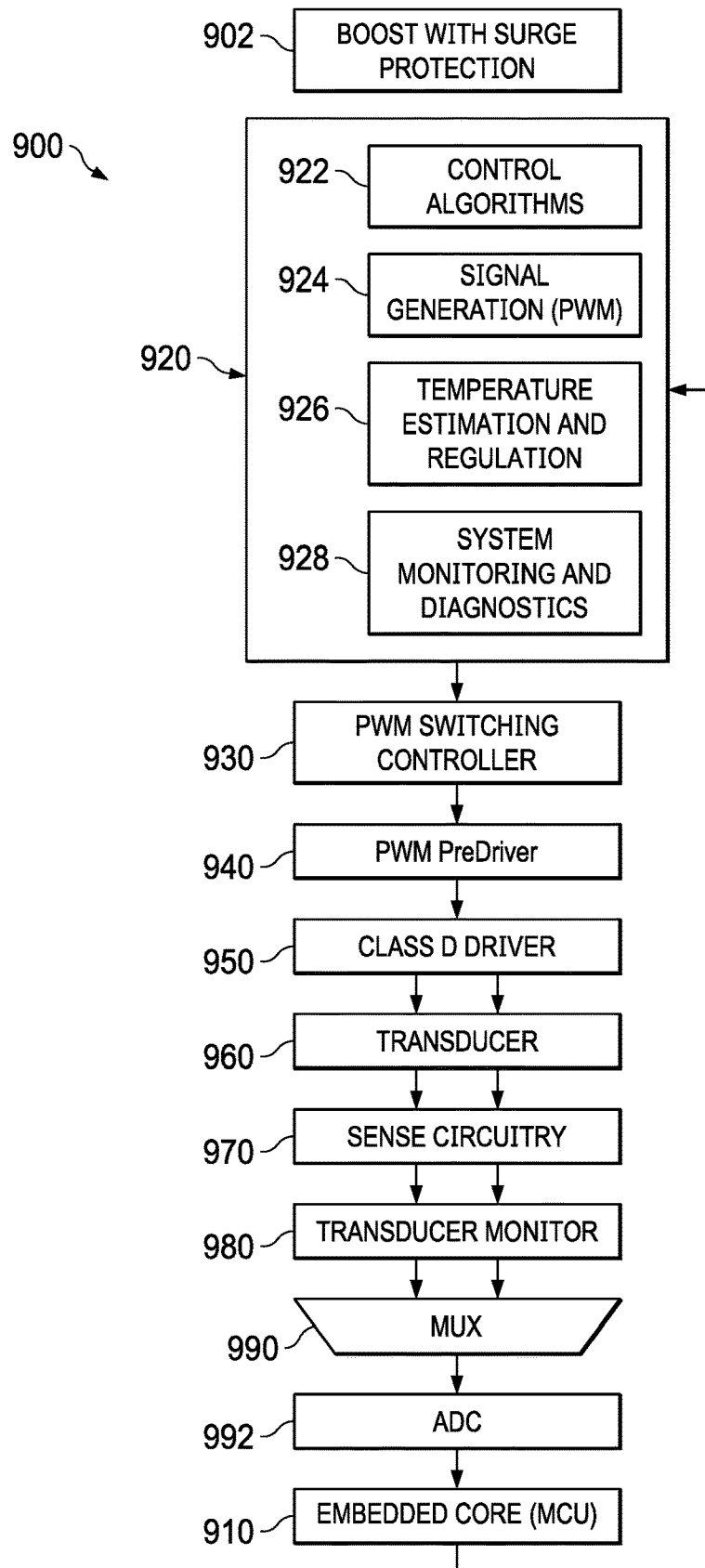
FIG. 9 is a block diagram of an example signal generator of an example camera lens cover system.

A control system described hereinbelow with respect to FIG. 9 is arranged to control the amount of heat generated so as to not overheat the piezoelectric material (which can damage the transducer actuator) and to avoid exceeding safe touch temperatures on the surface of the transparent element 730. The transducer temperature can be estimated by measuring the impedance of the lens cover system as described hereinabove.

FIG. 9 is a block diagram of an example signal generator of an example camera lens cover system. For example, the signal generator 900 is arranged to control signals for driving a transducer of the lens cover system, to monitor the transducer performance and to change aspects of the drive signals in response to the monitored transducer performance.

The signal generator 900 includes a voltage (V) boost circuit 902 that is arranged to receive power (such as 12 volts direct current input from a vehicle power system) and to generate a 50-volt potential (e.g., surge-protected potential) from the received 12-volt input power. The 50-volt potential is modulated as described hereinbelow for driving a transducer of the camera lens cover system.

The signal generator 900 also includes an embedded core (such as a microcontroller unit MCU) 910 for executing instructions to transform the embedded core into a special-purpose machine for executing the functions of the camera lens cover system controller 920. For example, the camera lens cover system controller 920 includes control algorithms 922, pulse width modulation (PWM) signal generation circuit 924, temperature estimation and regulation circuit 926 and system monitoring and diagnostics circuit 928. Such functions are described hereinbelow with respect to FIG. 10.

The camera lens cover system controller 920 is arranged to select operating parameters (such as modes, cleaning stages, frequencies and operating temperatures) for the camera lens cover system in response to monitoring the camera lens cover system transducer and to control the PWM switching controller 930 in response to the selected operating parameters. For example, the camera lens cover system controller 920 is arranged to control PWM switching times of the PWM switching controller 930. The PWM switching controller 930 is arranged to signal the PWM PreDriver 940 in response to the switching times received from the PWM switching controller 930. The PWM PreDriver 940 generates control signals for toggling (e.g., actuating) the switches of the Class D driver 950. The Class D Driver 950 is a full-bridge rectifier that is arranged to generate +/−50 volts (e.g., 100 volts peak-to-peak) for driving the transducer 960. The sense circuitry 970 generate current and voltage signals for sensing impedance of the camera lens cover system and transducer 960, which are monitored (e.g., buffered) by the transducer monitor 980. The monitor signals are coupled via a multiplexer (MUX) 990 to the analog-to-digital converter (ADC) 990 for sampling. The embedded core 910 is arranged to receive the sampled current and voltage signals, to compute (via the camera lens cover system controller 920) new PWM signaling, to perform temperature estimation and regulation and to perform system monitoring and diagnostics as described hereinbelow with respect to FIG. 10.

Figure 10:
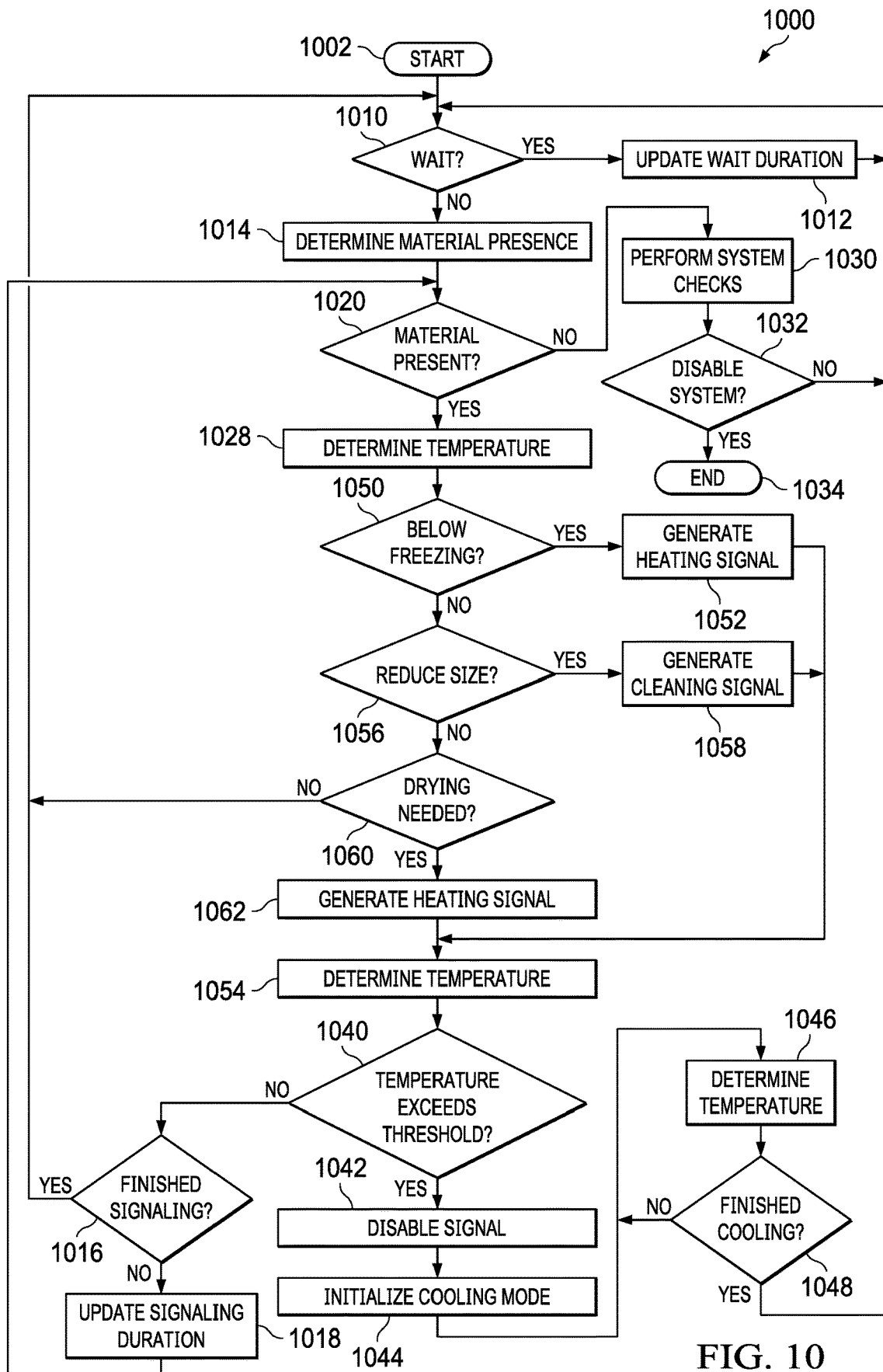
FIG. 10 is a flow diagram illustrating an example method of foreign contaminant removal from an exposed surface of the example camera lens cover system.

FIG. 10 is a flow diagram 1000 illustrating an example method of foreign contaminant removal from an exposed surface of the example camera lens cover system described herein. At 1002, the process begins in the camera lens cover system controller described hereinabove. At 1010, the camera lens cover system controller waits a period of time (e.g., waits for the system start signal) before identifying and/or determining the existence (presence) of contaminants at 1014. If the wait duration is not expired, the wait duration is updated at 1012, and the process loops back to 1010.

At 1014, after the wait period has expired, a frequency measurement device monitors the resonant frequency the example camera lens cover system to identify (for example) the amount of contaminant disposed on the exposed surface. For example, the amount of a contaminant can be determined in response to a measured frequency response of the camera lens cover system and comparing the measured frequency response to a database that includes known frequency responses for given types and amounts for specific contaminants. At 1020, the camera lens cover system controller determines whether a contaminating material exists (is present) on the camera lens cover, such that at least one operation for cleaning the camera lens cover is initiated. If "YES," then at 1028, the temperature of the example camera lens cover system is determined, and types of cleaning are selected in response to the determined temperature as described hereinbelow. If "NO," then system checks are performed at 1030.

If at 1020 the presence of a material is not indicated ("NO"), then at 1030, the process initiates system monitoring and diagnostics tests (e.g., during which the camera lens cover system is self-tested). At 1032, a decision is made as to whether to disable the system. For example, the determination whether to disable the system can be determined in response to the nature of faults diagnosed at 1030, a response to a user input and/or a response to whether the power has been turned off to the system. If the system is to be disabled ("YES"), then at 1034, the system is shut down. If the system is not to be disabled ("NO"), the process loops back to 1010 and waits for a specified duration before the process starts again.

As described hereinabove, at 1028, the temperature of the example camera lens cover system is determined. For example, the temperature of the example camera lens cover system can be determined in response to (e.g., as a function of) an operating frequency of an activated transducer as described hereinabove, or by a temperature sensing device (such as an externally coupled thermocouple). The process continues at 1050, for example.

If at 1050 the determined temperature is below the freezing point of water, then at 1052, the camera lens cover system controller generates a heating signal for a specified duration (e.g., time period). For example, the camera lens cover system controller can generate a heating excitation signal for warming the camera lens cover system as described hereinabove by exciting the transducer at a frequency at which the transducer generates relatively large amounts of heat.

At 1054, the temperature of the example camera lens cover system is determined. After the temperature is determined (e.g., after initiation of a heating or cleaning mode), the process continues at 1040, after which the process initiates further operations (described hereinbelow) to ensure, for example, the transducer is operated within a safe operating region of temperatures.

If at 1056 the type and size of detected contaminating material indicates the contaminating material is to be reduced in size, then at 1058, a cleaning signal is generated for cleaning the example camera lens cover system. For example, the camera lens cover system controller can select a cleaning mode in response to the size of detected contaminating material. The cleaning mode can be selected, such that the cleaning signal can be generated as one of a large-volume cleaning excitation signal, a medium-volume cleaning excitation signal and a small-volume cleaning excitation signal. The large-volume cleaning excitation signal can be generated at a frequency conducive to resonating larger size drops of water (for example), whereas the medium-volume cleaning excitation signal can be generated at a frequency conducive to resonating medium size drops of water (for example) and the small-volume cleaning excitation signal can be generated at a frequency conducive to heating small droplets of water. After the large-volume or medium-volume cleaning signal is generated and applied at 1058, the process continues at 1054 where the temperature of the example camera lens cover system is determined (e.g., to ensure, the transducer is operated within a safe operating region of temperatures).

If at 1060, the size of detected contaminating material indicates small droplets of water (for example), such that drying is indicated, then at 1062, a heating signal is generated for cleaning the example camera lens cover system. For example, the camera lens cover system controller can generate a heating signal such that water droplets of around 0-1 mm diameter are evaporated (e.g., atomized or otherwise dispersed) in response to the heat and vibration generated in response to the heating signal (e.g., applied at a frequency different from the respective frequencies of the applied cleaning signals). After the heating signal is generated and applied at 1062, the process continues at 1054 where the temperature of the example camera lens cover system is determined (e.g., to ensure, the transducer is operated within a safe operating region of temperatures).

After the temperature is determined (e.g., again) at 1054, the process continues at 1040, where a decision is made to determine whether the temperature of the example camera lens cover system exceeds a temperature threshold. For example, the temperature threshold can be half of the transducer Curie temperature, such that the transducer is controlled to operate within a safe temperature range. If "YES," the process proceeds to disable the applied signal (e.g. heating or cleaning signal) at 1042. At 1044, cooling of the transducer and/or exposed surface is initialized (e.g., by entering a delay period during which the heating or cleaning signal is disabled, such that additional heat is not generated). At 1046, the process determines the latest temperature, and in response at 1048, a decision is made to determine whether the transducer temperature has finished cooling. For example, the decision can be made in response to the information determined at 1046, such that the temperature can be determined to be below a selected temperature threshold. In an example, the temperature threshold can be half of the transducer Curie temperature, such that the transducer is controlled to operate within a safe temperature range. In another example, the temperature threshold can be less than the transducer Curie temperature. If "YES" (e.g., when finished cooling), then at 1048, the process loops back to 1010. If "NO," then at 1048, the process loops back to 1046, determines a latest temperature and loops back to 1048 (e.g., for additional cooling).

If "NO" at 1040 (e.g., when the transducer temperature does not exceed the temperature threshold), then at 1016, a decision is made to determine whether the cleaning process is complete. If "YES," then the process starts again at 1010. If "NO" at 1016, then at 1018, the cleaning signal duration is updated and the process loops back to 1020 for additional testing and potential cleaning operations.

Figure 11:
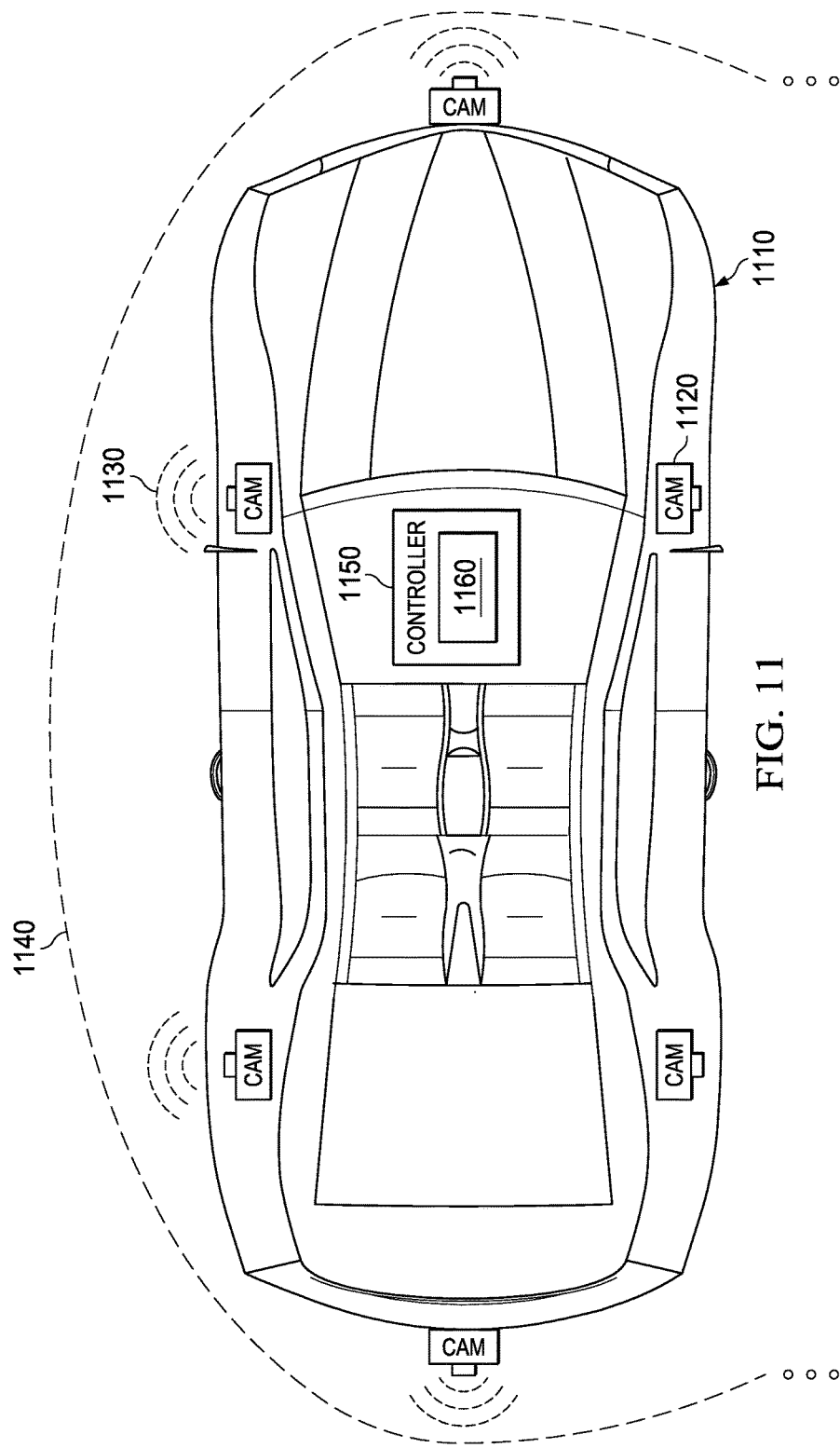
FIG. 11 is a top view of an example vehicle including example camera lens cover systems.

FIG. 11 is a top view of an example vehicle including example camera lens cover systems. The vehicle 1110 includes a vehicle body that includes an interior space sheltered from an exterior environment. The vehicle 1110 includes at least one camera coupled to the vehicle body, where each camera includes a lens element, where the lens element is transparent and is exposed to the exterior environment. The vehicle also includes at least one apparatus that includes a transducer arranged to vibrate the lens element at a selected operating frequency when operating in an activated state.

The vehicle 1110 further includes controller circuitry 1150 coupled to the vehicle, wherein the controller circuitry 1150 includes a user interface arranged to receive commands generated in response to an operator operating the vehicle 1110 from the interior space of the vehicle, wherein the controller circuitry 1150 is arranged to measure an impedance of the apparatus while the transducer is operating at the selected operating frequency, wherein the controller circuitry 1150 is arranged to determine an estimated temperature of the apparatus in response to the measured impedance, wherein the controller circuitry 1150 is arranged to compare the estimated temperature of the apparatus against a temperature threshold for delineating an operating temperature range of the apparatus, and wherein the controller circuitry 1150 is arranged to toggle an activation state of the transducer in response to comparing the estimated temperature of the apparatus against the temperature threshold. The controller circuitry 1150 can be arranged to measure an impedance of the apparatus in response to commands received from the operator operating the vehicle from the interior space of the vehicle 1110. The controller circuitry 1150 can also arranged to measure an impedance of the apparatus in response to the operator starting the vehicle 1110.

The controller circuitry 1150 includes a display 1160 (which can also include a touch screen) for displaying a synoptic view 1140 in response to each video signal of a local view 1430 of a local camera (CAM) 1420.

Modifications are possible in the described embodiments, and other embodiments are possible, within the scope of the claims.

What is claimed is:

1. A method of foreign contaminant removal from a lens system, comprising:
    determining whether contaminants are present on an exposed surface of the lens system;
    determining a first size of the contaminants and a type of the contaminants;
    measuring a first temperature of the exposed surface of the lens system and comparing the first temperature to a first temperature threshold;
    select a cleaning mode in response to the size of detected contaminating material, wherein vibration is the cleaning mode selected responsive to the first size being above a first size threshold;
    enabling a transducer responsive to vibration being chosen as the cleaning mode;
    determining a second size of the contaminants;
    heating the surface of the lens system responsive to the second size indicating a presence of water droplets on the surface;
    measuring a second temperature of the transducer and comparing the second temperature to a second temperature threshold; and
    cooling the transducer responsive to the second temperature being above the second temperature threshold.

2. The method of claim 1, wherein the size and type of contaminant is determined by comparing a system resonant frequency to a database of known frequency responses.

3. The method of claim 1, further comprising heating the lens system responsive to the first temperature being below the first temperature threshold.

4. The method of claim 1, wherein measuring the temperatures includes measuring an impedance of the transducer and comparing to values in a lookup table.

5. The method of claim 1, wherein the vibration cleaning mode includes:
    a large volume cleaning stage in which the transducer vibrates in a first mode at a first frequency;
    a medium volume cleaning stage in which the transducer vibrates in a second mode at a second frequency; and a small volume cleaning stage in which the transducer vibrates in a third mode at a third frequency.

6. The method of claim 5, wherein the second frequency is lower than the first frequency.

7. The method of claim 5, wherein the third frequency is higher than the first frequency.

8. The method of claim 5, wherein a heating excitation signal is used in the small volume cleaning stage to transfer heat to the lens system.

9. The method of claim 5, wherein the small volume cleaning stage is used to evaporate water droplets of approximately 1 mm or less in diameter.

10. The method of claim 5, wherein the first frequency, second frequency and third frequency are within a range of electromechanical resonance of the lens system.

11. The method of claim 1, wherein the second temperature threshold is below a Curie temperature of a piezoelectric material of the transducer.

12. The method of claim 1, wherein the second temperature threshold is less than half a Curie temperature of a piezoelectric material of the transducer.

13. A system, comprising:
a camera wherein the camera includes a transparent lens element;
a transducer configured to vibrate the lens element at an operating frequency; and
controller circuitry including a user interface configured to receive a command generated by an operator, wherein the controller circuitry is configured to:
measure an impedance of the transducer while the transducer is operating at the operating frequency;
determine an estimated temperature of the transducer in response to the measured impedance;
compare the estimated temperature against a temperature threshold for delineating an operating temperature range of the transducer; and
toggle an activation state of the transducer in response to comparing the estimated temperature against the temperature threshold.

14. The system of claim 13, wherein the controller circuitry is configured to measure the impedance in response to the command.

15. The system of claim 13, wherein the controller circuitry is configured to measure the impedance in response to power being applied to the system.

16. The system of claim 13, wherein the controller circuitry is configured to measure the impedance at periodic intervals.

17. The system of claim 13, further comprising a display configured to display a video image from the camera to the operator after the transducer has been activated.

* * * * *